(12) United States Patent
Fujiwara et al.

(10) Patent No.: US 12,014,899 B2
(45) Date of Patent: Jun. 18, 2024

(54) HIGH-FREQUENCY POWER SUPPLY DEVICE AND OUTPUT CONTROL METHOD THEREFOR

(71) Applicant: KYOSAN ELECTRIC MFG. CO., LTD., Yokohama (JP)

(72) Inventors: Takeshi Fujiwara, Yokohama (JP); Yuya Yasuda, Yokohama (JP); Ryuhei Katafuchi, Yokohama (JP); Hiroyuki Kojima, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 41 days.

(21) Appl. No.: 17/911,174

(22) PCT Filed: Mar. 4, 2021

(86) PCT No.: PCT/JP2021/008459
§ 371 (c)(1),
(2) Date: Sep. 13, 2022

(87) PCT Pub. No.: WO2021/187137
PCT Pub. Date: Sep. 23, 2021

(65) Prior Publication Data
US 2023/0124064 A1 Apr. 20, 2023

(30) Foreign Application Priority Data
Mar. 16, 2020 (JP) .................... 2020-045557

(51) Int. Cl.
*H01J 37/32* (2006.01)

(52) U.S. Cl.
CPC .. *H01J 37/32146* (2013.01); *H01J 37/32174* (2013.01); *H01J 2237/327* (2013.01)

(58) Field of Classification Search
CPC ........... H01J 37/32146; H01J 37/32174; H01J 2237/327; H01J 37/32165; H01J 2237/334; H05H 2242/22
See application file for complete search history.

(56) References Cited

U.S. PATENT DOCUMENTS

| | | | |
|---|---|---|---|
| 2005/0205532 A1 | 9/2005 | Patrick et al. | |
| 2007/0076344 A1 | 4/2007 | Hamaishi et al. | |

(Continued)

FOREIGN PATENT DOCUMENTS

| | | | |
|---|---|---|---|
| JP | H11-214363 A | 8/1999 | |
| JP | 2007-103102 A | 4/2007 | |

(Continued)

OTHER PUBLICATIONS

Office Action dated Sep. 5, 2023, issued in counterpart JP application No. 2020-045557, with English translation. (6 pages).

(Continued)

*Primary Examiner* — Jung Kim
(74) *Attorney, Agent, or Firm* — WHDA, LLP

(57) ABSTRACT

A high-frequency power supply device, which outputs high-frequency pulses to a target device on the basis of a synchronous pulse and a clock pulse, and the output control method therefor are such that a period reference signal is generated from output timing information pertaining to the synchronous pulse, an output level signal is generated from output level information, an output stop time is timed on the basis of the period reference signal and an output stop signal is generated, and, when the period reference signal, the output level signal, and the clock pulse are received and a high-frequency pulse is formed on the basis of these signals, transmission of the output level signal is stopped while the output stop signal is being received.

6 Claims, 10 Drawing Sheets

(56) References Cited

U.S. PATENT DOCUMENTS

| | | |
|---|---|---|
| 2014/0009073 A1 | 1/2014 | Valcore, Jr. et al. |
| 2014/0361690 A1 | 12/2014 | Yamada et al. |
| 2015/0122421 A1 | 5/2015 | Konno et al. |
| 2016/0079037 A1 | 3/2016 | Hirano et al. |
| 2016/0299548 A1 | 10/2016 | Grede et al. |
| 2020/0411286 A1 | 12/2020 | Koshimizu et al. |
| 2022/0301825 A1* | 9/2022 | Kubota ............. H01J 37/32091 |

FOREIGN PATENT DOCUMENTS

| | | | |
|---|---|---|---|
| JP | 2007-514300 A | 5/2007 | |
| JP | 2017-512355 A | 5/2017 | |
| JP | 2020-004710 A | 1/2020 | |
| JP | 2020004710 A * | 1/2020 | ........ H01J 37/32091 |
| WO | 2019/244734 A1 | 12/2019 | |

OTHER PUBLICATIONS

International Search Report dated May 25, 2021, issued in counterpart Application No. PCT/JP2021/008459. (2 pages).
Extended (Supplementary) European Search Report dated Feb. 27, 2024, issued in counterpart application No. 21771286.8. (8 pages).

\* cited by examiner

HIGH-FREQUENCY POWER SUPPLY DEVICE AND OUTPUT CONTROL METHOD THEREFOR

TECHNICAL FIELD

The present invention relates to a high-frequency power supply device to be applied to a plasma generation device and others, in particular a high-frequency power supply device for outputting a high-frequency pulse to a target device based on a synchronous pulse and a clock pulse, and to an output control method therefor.

BACKGROUND ART

A high-frequency power supply device is applied as a power source for ultrasonic oscillation, generation of induced power, plasma generation or others, and is a power supply device that combines a synchronous pulse for determining an output period of a high-frequency pulse and a clock pulse for determining a pulse period of a high-frequency component to be oscillated, thereby enabling to output a high-frequency pulse containing a high-frequency component over a predetermined period with a predetermined amplitude value. In particular, as a high-frequency power source to be applied to a plasma generation device, there is a switch-type high-frequency power supply device that has amplitude values respectively at a high level (first level) and a low level (second level) in one oscillation period.

As a plasma processing device adopting the above-mentioned switch-type high-frequency power supply device, for example, Patent Literature 1 discloses a plasma etching device that has a processing chamber filled with etching gas and accommodating a semiconductor wafer to be processed, in which an upper electrode and a lower electrode are disposed to face each other with the wafer to be processed being held between them, and a high-frequency voltage from a high-frequency power source is applied to the upper electrode and the lower electrode to cause electrical discharge between the upper electrode and the lower electrode so as to turn the etching gas into plasma, thereby performing etching process on the wafer to be processed. In such device, in order to perform uniform processing across the wafer to be processed, it is required that a voltage applied from the high-frequency power source is stable.

With a view to generating plasma stably in the plasma etching device, for example, Patent Literature 2 discloses a technique of feedback control, in which a matching network is connected between a high-frequency generator and a plasma processing chamber for converting a complex impedance of plasma viewed from an end of a transmission path into a nominal impedance of the high-frequency generator, so as to perform the feedback control on a voltage of an induction coil for feeding high-frequency power to the plasma processing chamber. According to the control technique, the matching network allows the feedback control to match phases of electric power waveforms applied to the induction coil to thereby stabilize substrate treatment.

CITATION LIST

Patent Literature

[Patent Literature 1] Japanese Patent Laid-Open Publication No. H11-214363

[Patent Literature 2] Japanese Patent Laid-Open Publication No. 2007-514300.

SUMMARY OF THE INVENTION

Problems to be Solved by the Invention

As described above, in the conventional high-frequency power supply device, a synchronous pulse generator for generating a synchronous pulse and a clock pulse generator for generating a clock pulse are typically provided separately, and since these generators operate independently, it is inevitable that phases of output waveforms generated based on clock pulses in high-frequency pulses output at timings based on the synchronous pulses are uneven at the time of changing output levels of the high-frequency pulses. As a result, between multiple high-frequency pulses which are consecutively oscillated, the number of pulses due to an amplitude at a first level and the number of pulses due to an amplitude at a second level are different from each other, thereby causing jitter.

In order to solve the above problem caused by the unstable output waveforms due to the oscillation mechanism in such high-frequency power supply device, for example, the above-described technique disclosed by Patent Literature 2 is applied that requires to provide an additional configuration (matching network or similar) between the plasma processing device and the high-frequency power supply device, and thus control of the power source must be complicated. Furthermore, if fluctuation of the output waveform of the high-frequency pulse occurs at speed faster than a response speed of the matching network, it cannot be dealt with the fluctuation, and this does not provide a fundamental solution to the problem that comes up when a switch-type high-frequency power supply device is employed.

The present invention is for solving the above-described conventional problem, and aims to provide a high-frequency power supply device and an output control method therefor that can always match the phases of the output high-frequency pulses even in the configuration of generating the synchronous pulse and the clock pulse separately.

Means for Solving the Problem

In order to solve the above problem, the present invention has a principal aspect that is a high-frequency power supply device for outputting a high-frequency pulse to a target device based on a synchronous pulse and a clock pulse, including a synchronous pulse generation mechanism that generates a synchronous pulse containing output level information and output timing information of the high-frequency pulse; an output level setting mechanism that generates an output level signal for setting an output level of the high-frequency pulse based on the output level information; and an oscillation mechanism that receives a period reference signal of the synchronous pulse and the output level signal to oscillate the high-frequency pulse, wherein the synchronous pulse generation mechanism includes a synchronous pulse formation circuit that forms the synchronous pulse, a period reference signal generation unit that generates a period reference signal at a period reference time of the synchronous pulse, and a clocking mechanism that clocks an output stop time based on the period reference signal and sends an output stop signal to the output level setting mechanism, the output level setting mechanism includes a level determination unit that determines an output level set in the high-frequency pulse in response to the output level signal, and a level setting signal generation unit that generates a level setting signal based on a result of the determination made by the level determination unit, the oscillation mechanism includes a clock pulse generator that generates the clock pulse, and an oscillation amplifier that receives the period reference signal, the level setting signal and the clock pulse to generate the high-frequency pulse based on these signals, wherein the output level setting mechanism stops sending out the level setting signal while the output stop signal is being received.

Another aspect of the invention is an output control method for a high-frequency power supply device which outputs a high-frequency pulse to a target device based on a synchronous pulse and a clock pulse, the method including generating an output level signal for setting an output level of the high-frequency pulse from output level information contained in a waveform of the synchronous pulse and generating a period reference signal from output timing information, generating a level setting signal based on the output level signal, and clocking an output stop time based on the period reference signal as well as generating an output stop signal, receiving the period reference signal, the level setting signal and the clock pulse, and when forming the high-frequency pulse based on these signals, stopping sending the level setting signal while the output stop signal is being received.

In accordance with the invention having the above-described configuration, the period reference signal based on the period pulse, the level setting signal and the clock pulse are received, and when forming the high-frequency pulse based on these signals, the output stop time is clocked based on the period reference signal while generating the output stop signal, and the level setting signal is not sent out during the reception of the output stop signal. Thus, even for a structure in which synchronous pulses and clock pulses are separately generated, the phases of high-frequency pulses that are output can consistently be made uniform.

BEST MODE FOR CARRYING OUT THE INVENTION

A description will now be made about representative illustrative embodiments of a high-frequency power supply device and an output control method therefor according to the present invention by referring to FIGS. 1 to 10(e).

Embodiment 1

Figure 1:
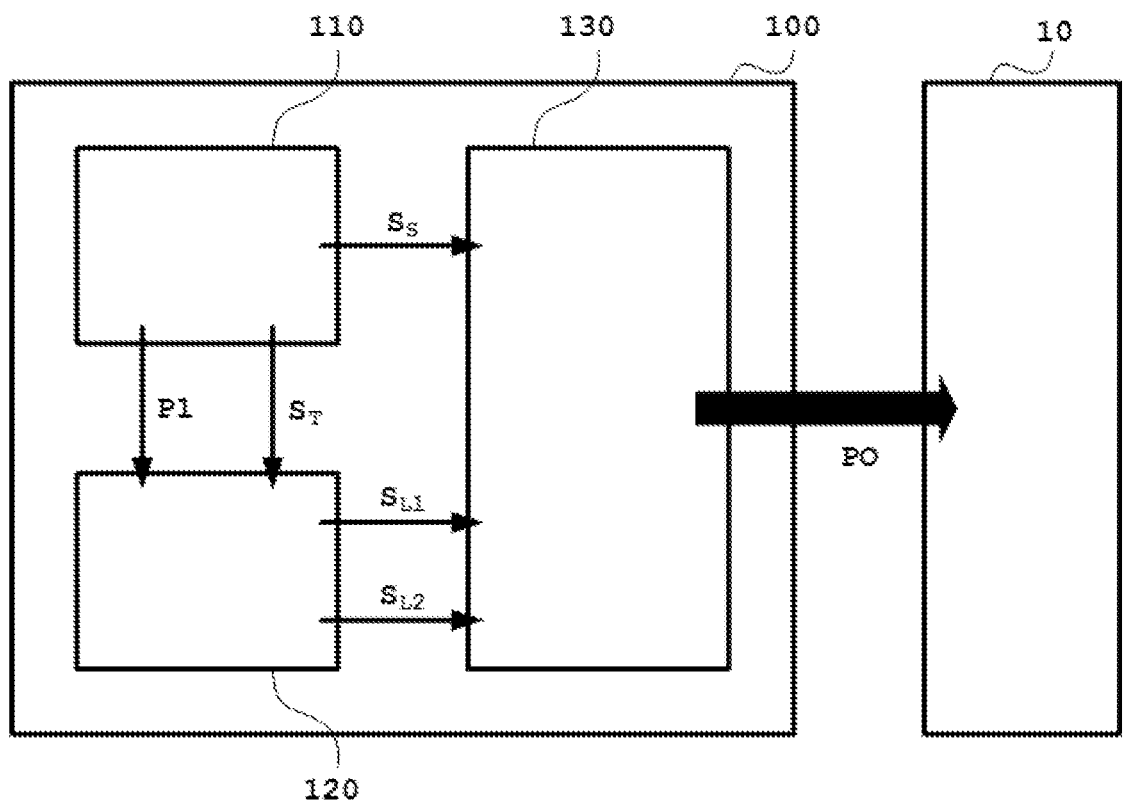
FIG. 1 is a block diagram showing a schematic configuration of a high-frequency power supply device according to Embodiment 1 which is a representative example of the invention.

FIG. 1 is a block diagram that shows a schematic configuration of a high-frequency power supply device according to Embodiment 1 which is a representative example of the invention. As shown in FIG. 1, a high-frequency power supply device 100 according to Embodiment 1 includes, by way of example, a synchronous pulse generation mechanism 110 that generates a synchronous pulse P1 that includes output level information and output timing information of a high-frequency pulse PO to be output, an output level setting mechanism 120 that generates output level signals $S_{L1}$, $S_{L2}$ for setting output levels of the high-frequency pulse PO based on the output level information of the synchronous pulse P1, and an oscillation mechanism 130 that receives a period reference signal $S_s$ based on the output timing information of the synchronous pulse P1 and the above-mentioned output level signals $S_{L1}$, $S_{L2}$ to thereby oscillate the high-frequency pulse PO. The high-frequency pulse PO output from the high-frequency power supply device 100 is fed to a target device 10, such as plasma or laser generation device, induction heating device, ultrasonic oscillation device or others.

Figure 2:
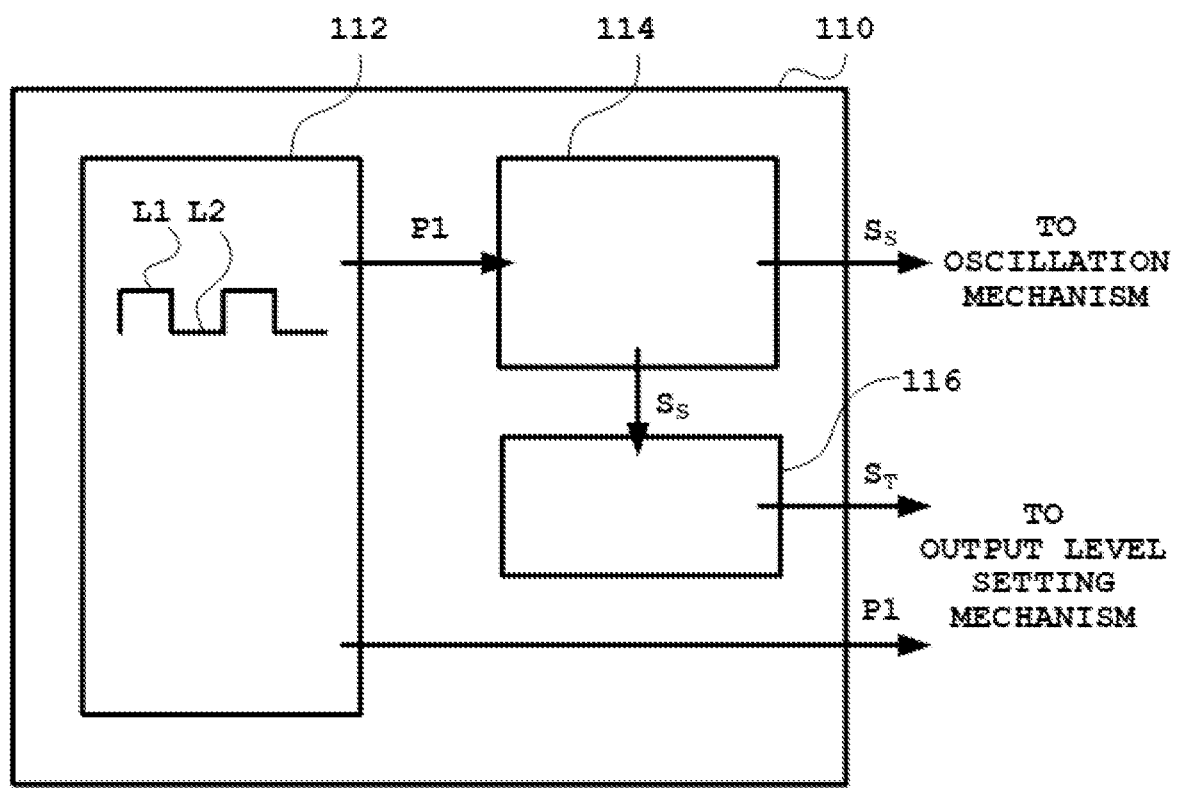
FIG. 2 is a block diagram showing an example of a specific configuration of a synchronous pulse generation mechanism according to Embodiment 1.

FIG. 2 is a block diagram showing an example of a specific configuration of the synchronous pulse generation mechanism according to Embodiment 1. As shown in FIG. 2, the synchronous pulse generation mechanism 110 of Embodiment 1 includes a synchronous pulse formation circuit 112 that forms the above-mentioned synchronous pulse P1, a period reference signal generation unit 114 that generates the period reference signal $S_s$ at a period reference time in the synchronous pulse P1, and a clocking mechanism 116 that clocks an output stop time based on the period reference signal $S_s$ to send out an output stop signal $S_T$ to the output level setting mechanism 120. In addition to that, the synchronous pulse P1 output from the synchronous pulse formation circuit 112 is also fed to the output level setting mechanism 120, which will be described later.

The synchronous pulse formation circuit 112 includes output level information (amplitude value) and output timing information (amplitude changing timing), by way of example, and outputs an approximately rectangular periodic pulse waveform that defines two output levels L1, L2 on a vertical axis with respect to an elapsed time on a horizontal axis. Although FIG. 2 illustrates the case where the output levels are the high level L1 and the low level L2, the pulse waveform may have three or more output levels as long as the waveform is an approximately rectangular periodic wave.

In addition to that, the synchronous pulse P1 is not limited to the rectangular wave, and may include any waveform that contains the output level information and the output timing information, such as sine wave or extremely-short pulse. Furthermore, the synchronous pulse P1 may consist of a plurality of signal waveforms. For example, there is a technique for performing AND operation on a plurality of signal waveforms to obtain an output level and output timing.

The period reference signal generation unit 114 uses the synchronous pulse P1 received from the synchronous pulse formation circuit 112 to identify the output timing information which is a time reference of a period as one of the features of this synchronous pulse P1, and outputs the period reference signal $S_s$ at the identified timing. In this context, the time reference of the period is a time of switching from the low level L2 to the high level L1 (rising time), by way of example. Moreover, the number of the period reference signals $S_s$ is not limited to one in one period, and for example, a time of switching from the high level L1 to the low level L2 (falling time) may be employed, in addition to the above-mentioned rising time from the low level L2 to the high level L1.

The clocking mechanism 116 is configured, by way of example, to receive the period reference signal $S_s$ from the period reference signal generation unit 114, and then continue to send out an output stop signal $S_T$ to the output level setting mechanism 120, which will be described later, from the time of receiving the period reference signal until after a lapse of a predetermined output stop time. In this case, the clocking mechanism 116 is configured such that any timing can be selected for the predetermined output stop time with respect to a clock period of a clock pulse generator 132, which will be described later (see FIG. 4). This enables to arbitrarily select timing when the sending of the output stop signal $S_T$ is stopped.

Figure 3:
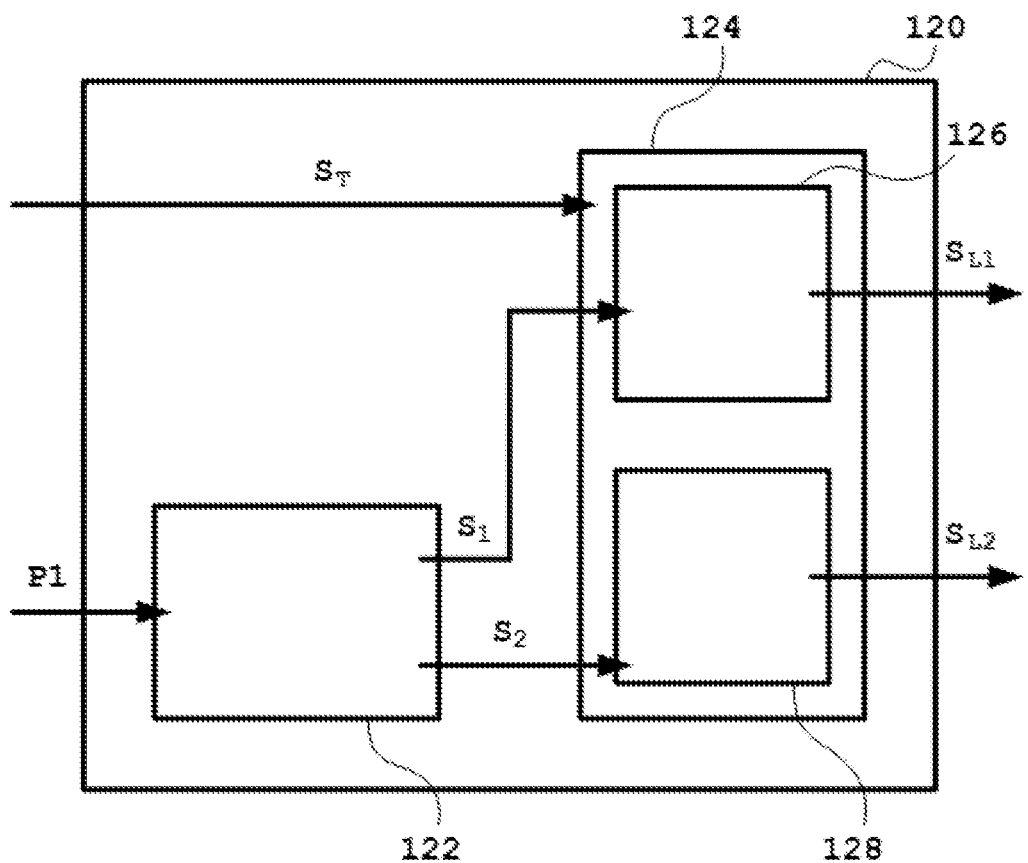
FIG. 3 is a block diagram showing an example of a specific configuration of an output level setting mechanism according to Embodiment 1.

FIG. 3 is a block diagram showing an example of a specific configuration of the output level setting mechanism according to Embodiment 1. As shown in FIG. 3, the output level setting mechanism 120 of Embodiment 1 includes a level determination unit 122 for issuing a first level setting command $S_1$ or second level setting command $S_2$ in accordance with an amplitude value (output level information) of the synchronous pulse P1, and a level setting signal generation unit 124 for generating level setting signals (first level setting signal $S_{L1}$ and second level setting signal $S_{L2}$) in response to the output stop signal $S_T$ as well as the first level setting command $S_1$ and the second level setting command $S_2$. Furthermore, the level setting signal generation unit 124 includes a first level setting signal generator 126 for generating the first level setting signal $S_{L1}$ while the first level setting command $S_1$ is being received, and a second level setting signal generator 128 for generating the second level setting signal $S_{L2}$ while the second level setting command $S_2$ is being received.

The level determination unit 122 is configured to receive the synchronous pulse P1 from the synchronous pulse formation circuit 112, and send out a predetermined setting command in real time according to the output level of the received synchronous pulse P1. For example, the level determination unit 122 in Embodiment 1 sends out the first level setting command $S_1$ while the synchronous pulse P1 is at the high level L1, and when the level of the synchronous pulse P1 is changed to the low level L2, sends out the second level setting command $S_2$.

The first level setting signal generator 126 generates the first level setting signal $S_{L1}$ in response to the first level setting command $S_1$ received from the level determination unit 122. Correspondingly, the second level setting signal generator 128 generates the second level setting signal $S_{L2}$ in response to the second level setting command $S_2$ received from the level determination unit 122. In this connection, the level setting signal generation unit 124 is configured not to output the first level setting signal $S_{L1}$ generated by the first level setting signal generator 126 or the second level setting signal $S_{L2}$ generated by the second level setting signal generator 128 to the oscillation mechanism 130 while receiving the output stop signal $S_T$ from the synchronous pulse generation mechanism 110.

Figure 4:
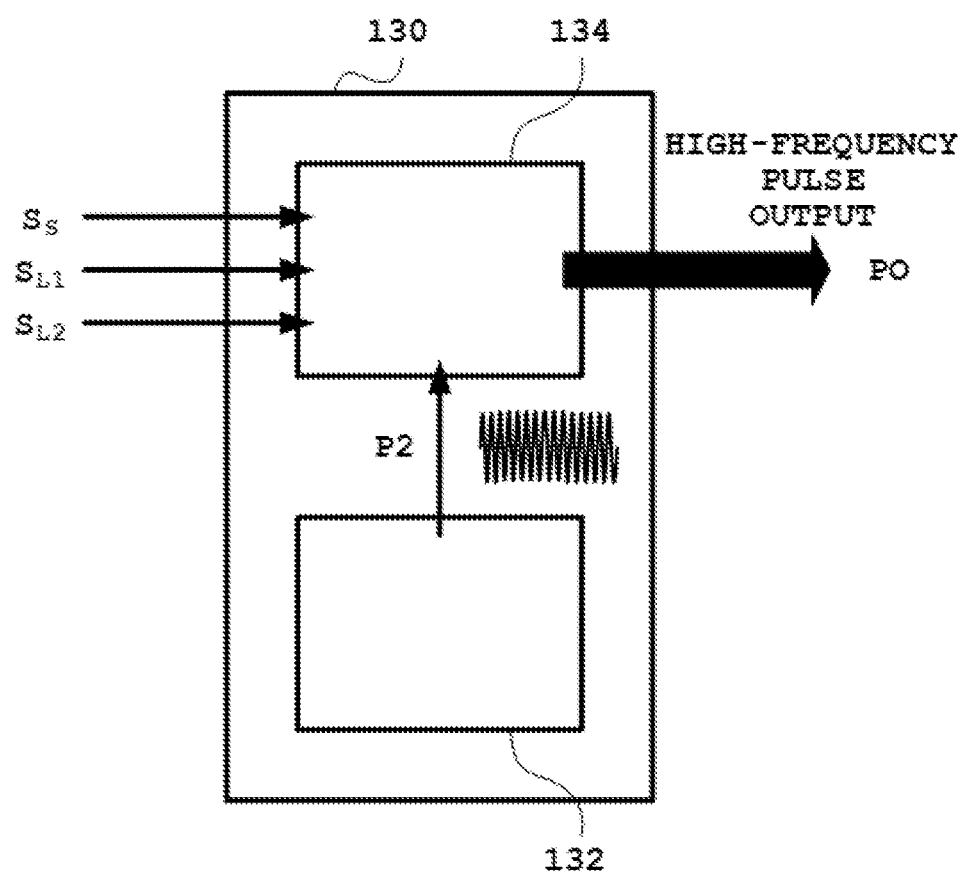
FIG. 4 is a block diagram showing an example of a specific configuration of an oscillation mechanism according to Embodiment 1.

FIG. 4 is a block diagram showing an example of a specific configuration of the oscillation mechanism according to Embodiment 1. As shown in FIG. 4, the oscillation mechanism 130 includes a clock pulse generator 132 for generating a clock pulse P2 in a predetermined high frequency range, and an oscillation amplifier 134 for receiving the period reference signal $S_s$ from the synchronous pulse generation mechanism 110, the first level setting signal $S_{L1}$ and the second level setting signal $S_{L2}$ from the output level setting mechanism 120, and the above-mentioned clock pulse P2, so as to form a high-frequency pulse PO based on these signals.

The clock pulse generator 132 is for generating the clock pulse P2 at high frequency (several hundreds of kHz to several tens of MHz) according to the output of the high-frequency pulse PO, e.g., generating the clock pulse P2 of 13.56 MHz. Moreover, in addition to generating the above-described clock pulse P2 at a certain high frequency at regular intervals, the clock pulse generator 132 has another function of resetting timing of the generation of the clock pulse P2 (set to a desired phase) at a desired time $t_{rst}$ (see FIGS. 5(a) to 5(e) or 6(a) to 6(e)). Furthermore, the oscillation amplifier 134 determines oscillation timing for the high-frequency pulse PO based on the period reference signal $S_s$, and amplifies the amplitude value of the clock pulse P2 based on the first level setting signal $S_{L1}$ and the second level setting signal $S_{L2}$ to generate the high-frequency pulse PO.

Figure 5A:
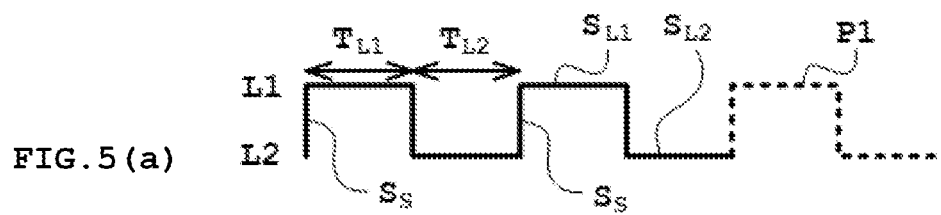
FIGS. 5(a) to 5(e) are a graph showing an example of an output waveform obtained by an output control method for the high-frequency power supply device according to Embodiment 1.

FIGS. 5(a) to 5(e) are a graph showing an example of an output waveform that can be obtained by an output control method for the high-frequency power supply device according to Embodiment 1. In the output control method for the high-frequency power supply device according to Embodiment 1, as shown in FIG. 5(a) as an example, the synchronous pulse P1 formed by the synchronous pulse formation circuit 112 in the synchronous pulse generation mechanism 110 is formed as a periodic pulse signal that will be at the high level L1 at an interval of a time $T_{L1}$ and at the low level L2 at an interval of a time $T_{L2}$. Then, as described above, a rising time to the high level L1, which is a time reference of one pulse period, is derived from the concerned synchronous pulse P1, and the period reference signal generation unit 114 sends out the period reference signal $S_s$ at each rising time, by way of example.

The synchronous pulse P1 is also fed to the output level setting mechanism 120, and the level determination unit 122 in the output level setting mechanism 120 sets an output level for each time, so that the first level setting signal generator 126 or the second level setting signal generator 128 sends out the first level setting signal $S_{L1}$ or the second level setting signal $S_{L2}$ to the oscillation mechanism 130. That is to say, by referring to FIG. 5(a), the first level setting signal $S_{L1}$ is sent out at the interval of the time $T_{L1}$ and the second level setting signal $S_{L2}$ is sent out at the interval of the time $T_{L2}$.

Figure 5B:
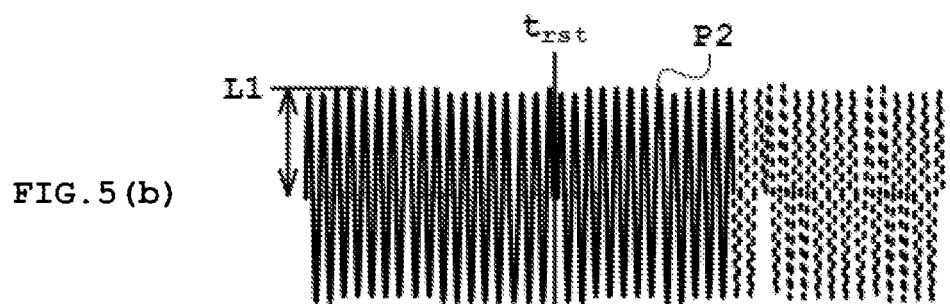
Figure 5C:
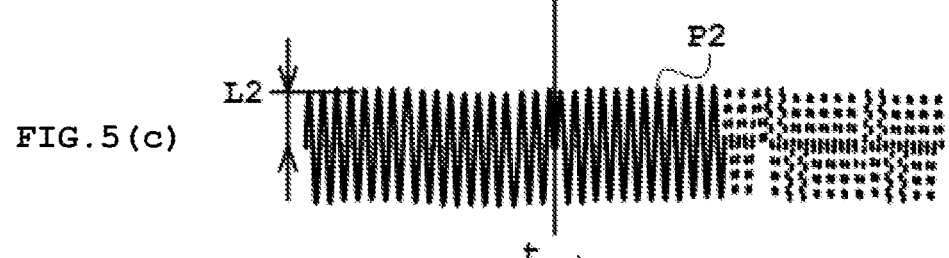

Then, the oscillation amplifier 134 in the oscillation mechanism 130 amplifies an amplitude value of the clock pulse P2 in accordance with the received first level setting signal $S_{L1}$ or second level setting signal $S_{L2}$. More specifically, when the first level setting signals $S_{L1}$ are received repeatedly, consecutive pulses having average height of the clock pulse P2 at the high level L1 are output as shown in FIG. 5(b). When the second level setting signals $S_{L2}$ are received repeatedly, consecutive pulses having average height of the clock pulse P2 at the low level L2 are output as shown in FIG. 5(c).

Figure 5D:
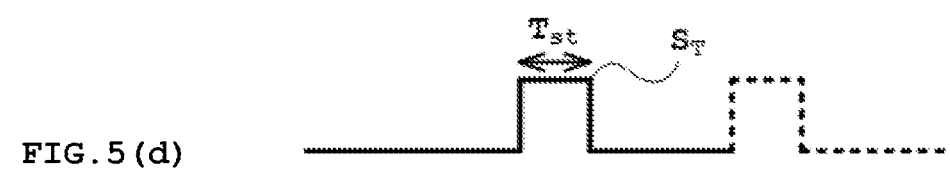
Figure 5E:
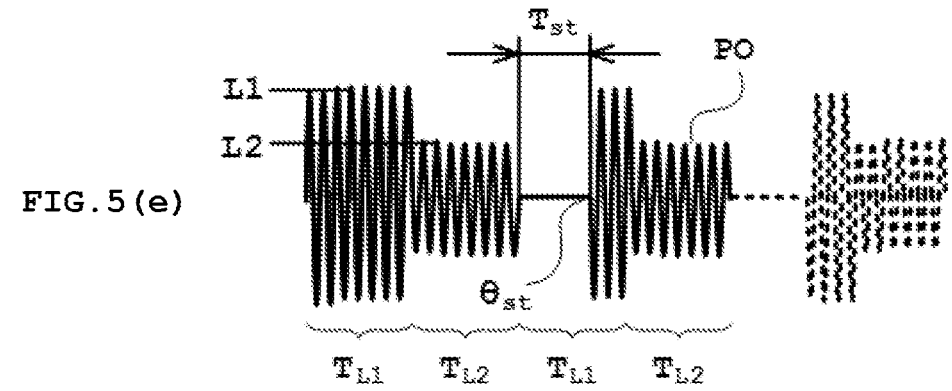

As shown in FIG. 5(d), when an output stop signal $S_T$ that will be an output stop time $T_{st}$ is sent out from the clocking mechanism 116, the clock pulse P2 formed by the clock pulse generator 132 is reset at an arbitrary time $t_{rst}$ during the output stop time $T_{st}$ (the arbitrary time is defined as "rest time $t_{rst}$"). Then, when this operation is performed continuously over time from the generation of the synchronous pulse P1, the outputting of the high-frequency pulse PO is started at a time of receiving the period reference signal $S_s$ by the oscillation mechanism 130, and thereby continuous pulses at the high level L1 are output at the interval of time $T_{L1}$, as shown in FIG. 5(e). Correspondingly, continuous pulses at the low level L2 are output at the interval of the time $T_{L2}$.

As described above, since the output level setting mechanism 120 is configured not to send out the first level setting signal $S_{L1}$ while the output stop signal $S_T$ is being received, the continuous pulses at the high level L1 are not output from the start of the interval of the time $T_{L1}$ until after a lapse of the output stop time $T_{st}$. In this case, the timing of the reset time t rst is defined in accordance with a phase $\theta_{st}$ of the high-frequency pulse PO that is firstly output after the expiration of the output stop time $T_{st}$. More specifically, a phase of the clock pulse P2 is reset at the reset time $t_{rst}$, so that the phase of the high-frequency pulse PO after the lapse of the output stop time $T_{st}$ will be the same phase at all times.

Figure 6A:
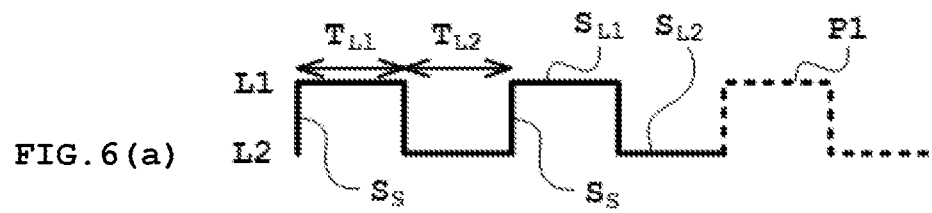
FIGS. 6(a) to 6(e) are a graph showing a variation of the output waveform obtained by the output control method for the high-frequency power supply device according to Embodiment 1.

FIGS. 6(a) to 6(e) are a graph showing a variation of an output waveform obtained by the output control method for the high-frequency power supply device according to Embodiment 1. As shown in FIG. 6(a), in the output control method for the high-frequency power supply device according to the variation shown in FIGS. 6(a) to 6(e). for instance, a rising time to the high level L1, which is a time reference of one pulse period, is firstly derived from a synchronous pulse P1 formed by the synchronous pulse formation circuit 112 in the synchronous pulse generation mechanism 110, and the period reference signal generation unit 114 sends out a period reference signal $S_s$ at each rising time, as with the case shown in FIGS. 5(a) to 5(e). Furthermore, the output level setting mechanism 120 sends out a first level setting signal $S_{L1}$ at an interval of a time $T_{L1}$ and a second level setting signal $S_{L2}$ at an interval of a time $T_{L2}$ to the oscillation mechanism 130.

Figure 6B:
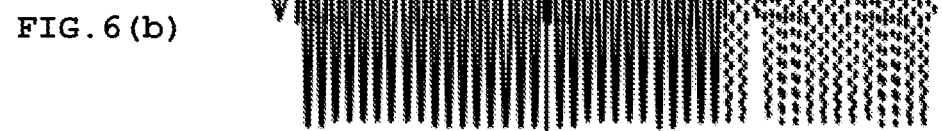
Figure 6C:
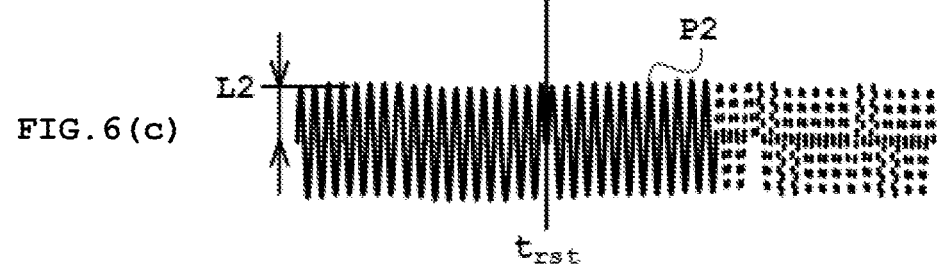

Secondly, as with the case of FIGS. 5(a) to 5(e), the oscillation amplifier 134 in the oscillation mechanism 130 amplifies an amplitude value of a clock pulse P2 in accordance with the received first level setting signal $S_{L1}$ or second level setting signal $S_{L2}$. Then, consecutive pulses having average height of the clock pulse P2 at the high level L1 as shown in FIG. 6(b) and consecutive pulses having average height of a clock pulse P2 at a low level L2 as shown in FIG. 6(c) are output.

Figure 6D:
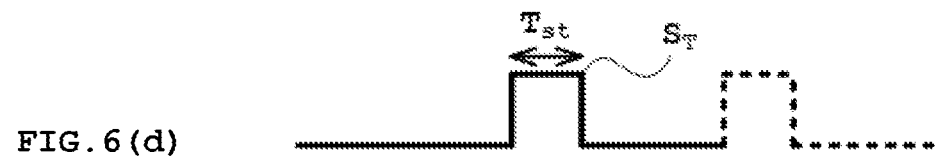
Figure 6E:
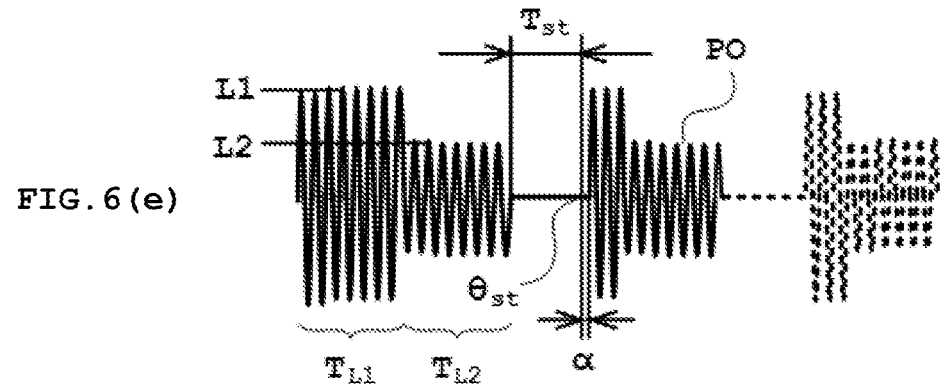

As shown in FIG. 6(d), when an output stop signal $S_T$ that will be an output stop time $T_{st}$ is sent out from the clocking mechanism 116, the clock pulse P2 formed by the clock pulse generator 132 is reset at an arbitrary time $t_{rst}$ during the output stop time $T_{st}$ (the arbitrary time is defined as "reset time $t_{rst}$"). Since the output level setting mechanism 120 is configured not to send out the first level setting signal $S_{L1}$ while receiving the output stop signal $S_T$, when this operation is performed continuously over time from the generation of the synchronous pulse P1, the outputting of a high-frequency pulse PO is started at a time of receiving the period reference signal $S_s$ by the oscillation mechanism 130, and thereby the continuous pulses at the high level L1 are output at the interval of time $T_{L1}$, as shown in FIG. 6(e). Correspondingly, the continuous pulses at the low level L2 are output at the interval of the time $T_{L2}$.

At this time, in the variation shown in FIGS. 6(a) to 6(e), timing of the reset time $t_{rst}$ is set such that a phase $\theta_{st}$ of the high-frequency pulse PO, which is the first to be output after a lapse of the output stop time $T_{st}$, is zero at all times. Thus, the reset of the phase of the clock pulse P2 at the reset time test enables to stably output the high-frequency pulse PO after the lapse of the output stop time $T_{st}$ such that the phase of the pulse PO is zero at all times, and yet at the same time, the outputting of the pulse PO delays by a waiting time a for matching output phases to be zero, as shown in FIG. 6(e).

With the above-described configuration, the high-frequency power supply device and the output control method therefor according to Embodiment 1 are adapted to receive the period reference signal $S_s$ based on the synchronous pulse P1, the first level setting signal $S_{L1}$, the second level setting signal $S_{L2}$ and the clock pulse P2, and when forming the high-frequency pulse PO based on these signals, set the output stop time T s clocked based on the period reference signal $S_s$ to be integral multiple of the clock period of the clock pulse P2, and thereby the output level setting mechanism stops sending out the first level setting signal $S_{L1}$ or second level setting signal $S_{L2}$ while the output stop signal $S_T$ is being received, so that the phases of the output high-frequency pulse can be matched on all occasions even if the synchronous pulse and the clock pulse are generated separately.

Embodiment 2

Figure 7:
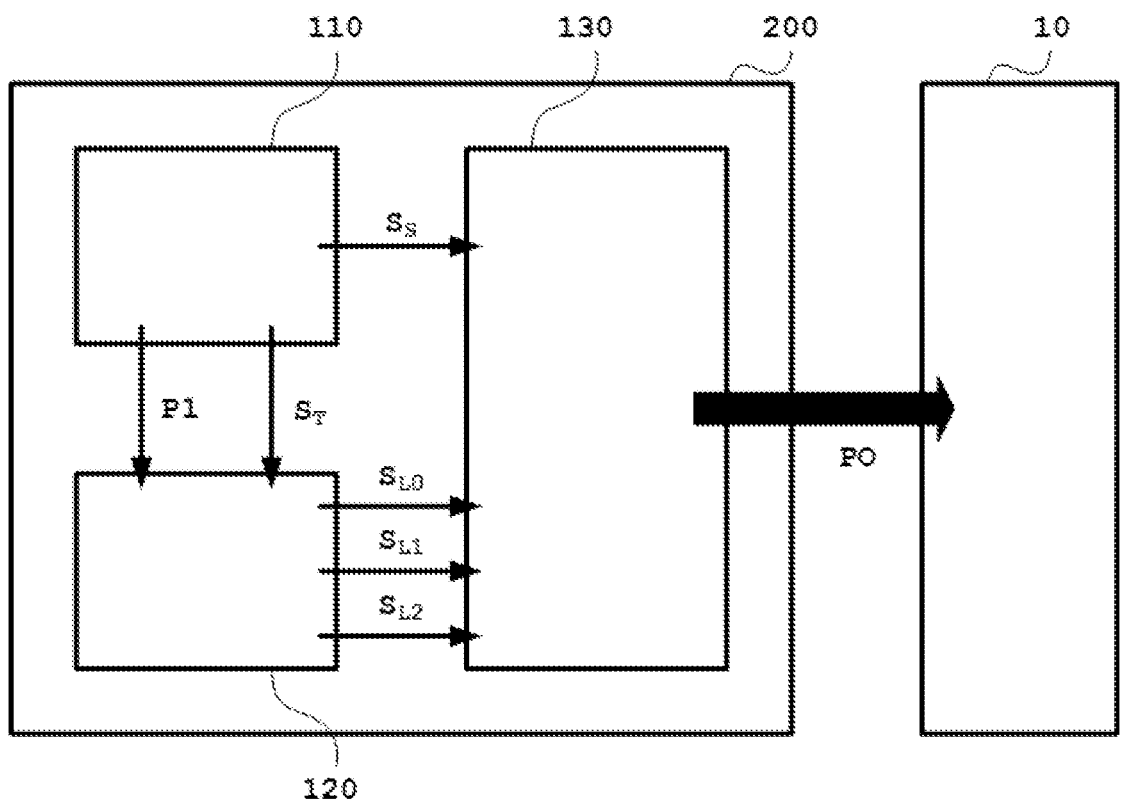
FIG. 7 is a block diagram showing a schematic configuration of a high-frequency power supply device according to Embodiment 2.

FIG. 7 is a block diagram showing a schematic configuration of a high-frequency power supply device according to Embodiment 2. In here, constituent elements of a high-frequency power supply device 200 according to Embodiment 2 that are the same as or similar to those of Embodiment 1 will be denoted by the same reference numerals in Embodiment 1, and the descriptions about them will not be repeated.

As shown in FIG. 7, the high-frequency power supply device 200 according to Embodiment 2 includes a synchronous pulse generation mechanism 110, an output level setting mechanism 120 and an oscillation mechanism 130. The high-frequency power supply device 200 of Embodiment 2 differs from the high-frequency power supply device 100 of Embodiment 1 in that the output level setting mechanism 120 sends out a level-zero signal $S_{L0}$ to the oscillation mechanism 130.

Figure 8:
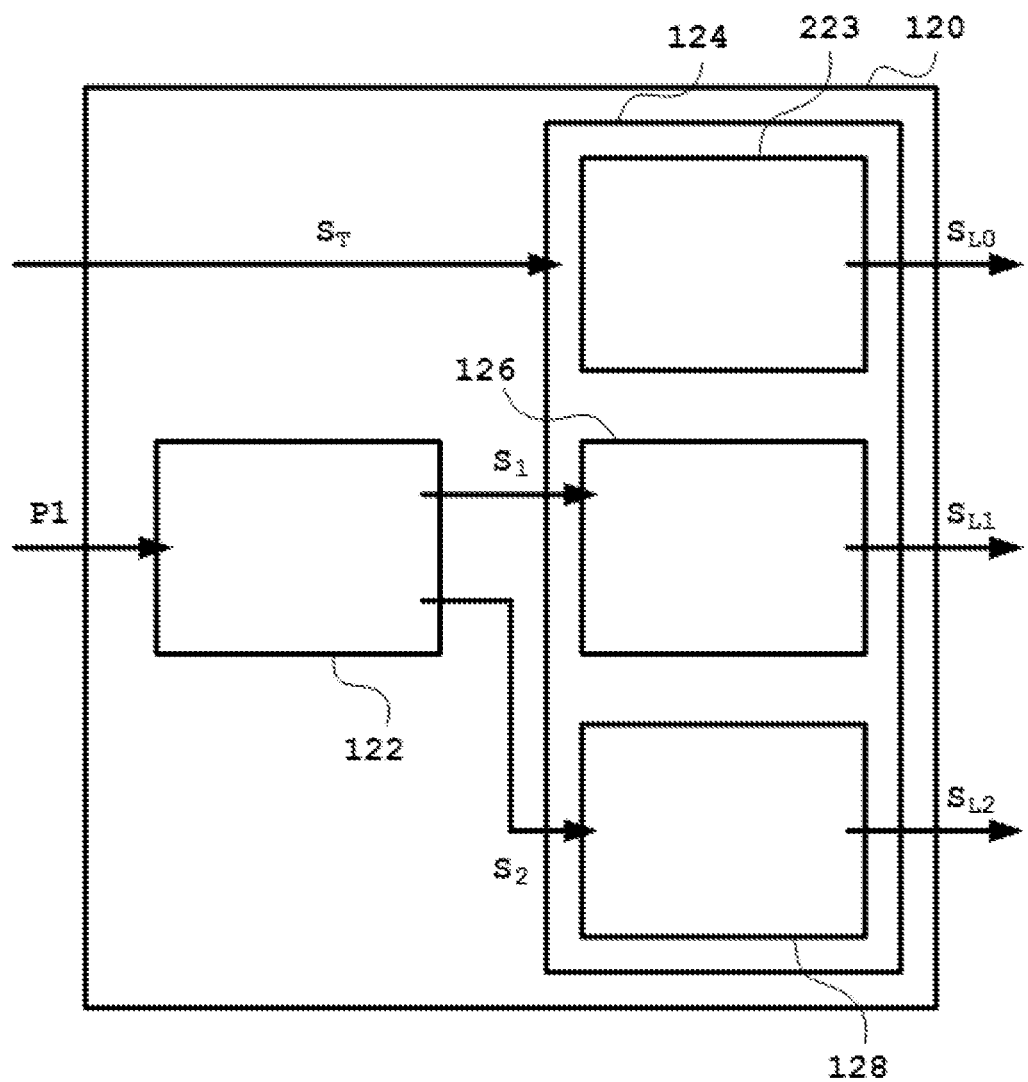
FIG. 8 is a block diagram showing an example of a specific configuration of an output level setting mechanism according to Embodiment 2.

FIG. 8 is a block diagram showing an example of a specific configuration of the output level setting mechanism according to Embodiment 2. As shown in FIG. 8, the output level setting mechanism 120 according to Embodiment 2 includes a level determination unit 122 that receives an output stop signal $S_T$ and a synchronous pulse P1, and issues a first level setting command $S_1$ or second level setting command $S_2$ in accordance with an amplitude value (output level) of the synchronous pulse P1, and a level setting signal generation unit 124 that generates level setting signals (level-zero signal $S_{L0}$, first level setting signal $S_{L1}$ and second level setting signal $S_{L2}$) in response to the output stop signal $S_T$ as well as the first level setting command $S_1$ and the second level setting command $S_2$. In addition to that, the level setting signal generation unit 124 includes a level-zero signal generator 223 that generates the level-zero signal $S_{L0}$ based on the output stop signal $S_T$, and a first level setting signal generator 126 and a second level setting signal generator 128, which are similar to those of Embodiment 1.

The level determination unit 122 is configured, as with the case of Embodiment 1, to receive the synchronous pulse P1 from the synchronous pulse formation circuit 112, and according to the output level of the synchronous pulse P1, send out the first level setting command $S_1$ while the synchronous pulse P1 is at a high level L1 and send out the second level setting command $S_2$ when the level of the synchronous pulse P1 is changed to a low level L2.

The level-zero signal generator 223 is configured to be activated while the level setting signal generation unit 124 is receiving the output stop signal $S_T$, and send out the level-zero signal $S_{L0}$ that makes an amplitude value of a high-frequency pulse PO to be zero while the output stop signal $S_T$ is being received. On the other hand, the first level setting signal generator 126 and the second level setting signal generator 128 are configured, as with the case of Embodiment 1, to receive the first level setting command $S_1$ or second level setting command $S_2$ from the level determination unit 122 to thereby send out the first level setting signal $S_{L1}$ or second level setting signal $S_{L2}$ to the oscillation mechanism 130. In this way, the level setting signal generation unit 124 outputs only the level-zero signal Sm to the oscillation mechanism 130 and does not output the first level setting signal $S_{L1}$ or second level setting signal $S_{L2}$ while receiving the output stop signal $S_T$ from the synchronous pulse generation mechanism 110.

Figure 9:
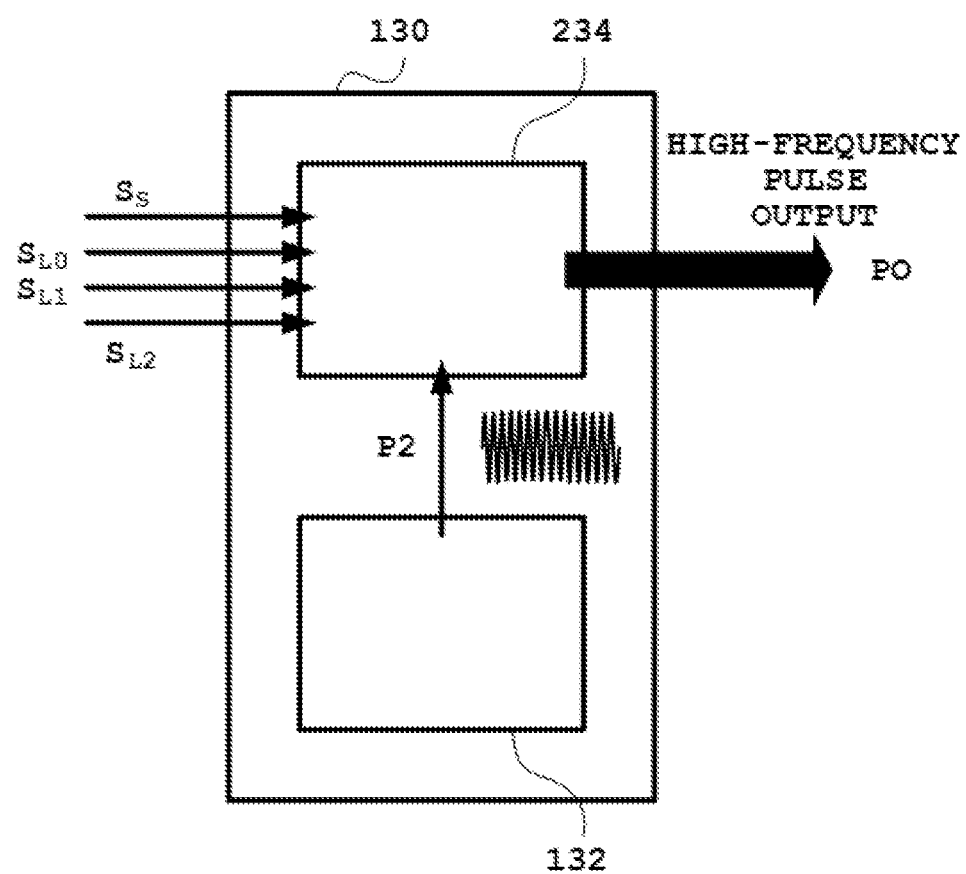
FIG. 9 is a block diagram showing an example of a specific configuration of an oscillation mechanism according to Embodiment 2.
Figure 10A:
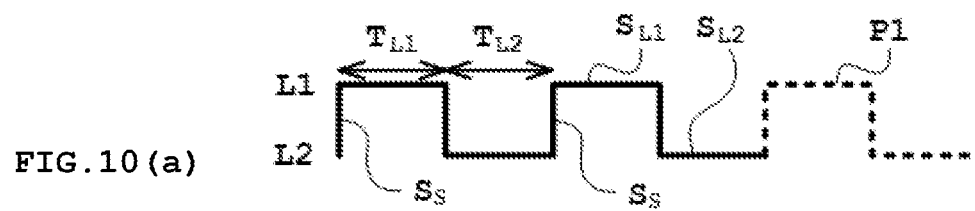
FIGS. 10(a) to 10(e) are a graph showing an example of an output waveform obtained by an output control method for the high-frequency power supply device according to Embodiment 2.
Figure 10B:
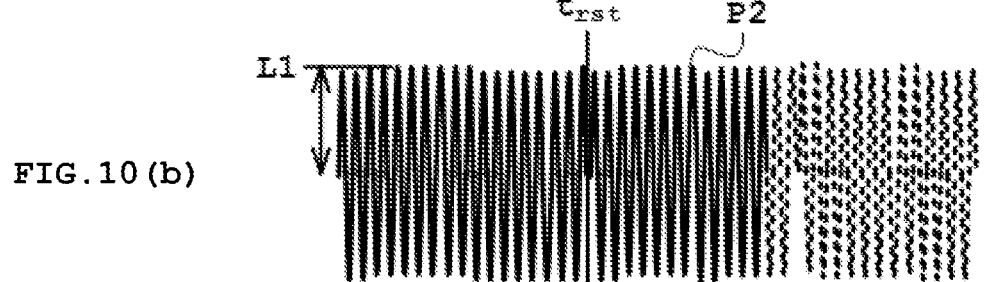
Figure 10C:
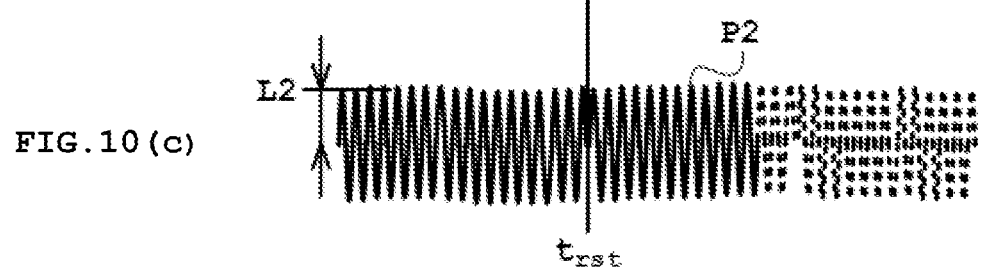
Figure 10D:
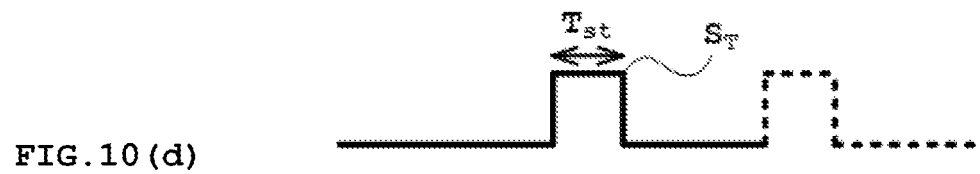
Figure 10E:
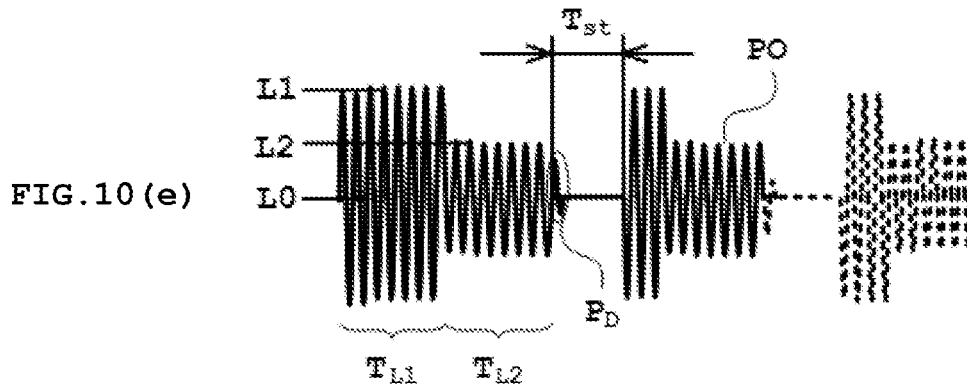

FIG. 9 is a block diagram showing an example of a specific configuration of the oscillation mechanism according to Embodiment 2. As shown in FIG. 9, the oscillation mechanism 130 of Embodiment 2 includes a clock pulse generator 132, and an oscillation amplifier 234 that receives a period reference signal $S_s$ from the synchronous pulse generation mechanism 110, the level-zero signal $S_{L0}$, the first level setting signal $S_{L1}$ and the second level setting signal $S_{L2}$ from the output level setting mechanism 120, and the clock pulse P2, so as to form a high-frequency pulse PO based on these signals.

The oscillation amplifier 234 according to Embodiment 2 is configured to determine oscillation timing for the high-frequency pulse PO based on the period reference signal $S_s$, and define an amplitude value of the high-frequency pulse PO to be zero while receiving the level-zero signal $S_{L0}$. On the other hand, when the first level setting signal $S_{L1}$ and the second level setting signal $S_{L2}$ are being received, the oscillation amplifier 234 amplifies the amplitude value of the clock pulse P2 to be at a high level L1 or low level L2 based on the received signals, so as to generate the high-frequency pulse PO.

FIGS. 10(*a*) to 10(*e*) are a graph showing an example of an output waveform obtained by the high-frequency power supply device and an output control method therefor according to Embodiment 2. In the output control method for the high-frequency power supply device according to Embodiment 2, the relationship between a synchronous pulse P1 and an output stop signal $S_T$ shown in FIGS. 10(*a*) to 10(*d*) and amplification of amplitude values with respect to a high level L1 and a low level L2 of a high-frequency pulse PO is the same as the relationship in Embodiment 1, and thus a description about it will not be repeated in here.

In the output control method for the high-frequency power supply device of Embodiment 2, the output level setting mechanism controls the outputting of the level-zero signal $Z_{L0}$ for making the output level to be zero to the oscillation mechanism while the output stop signal $S_T$ is being output, thereby enabling to perform the control such that even if a dummy bounce pulse (damping pulse $P_D$) is produced due to the switching of the output level at an end of an output interval (time $T_{L2}$) of a last high-frequency pulse PO, an erroneous pulse output is prevented by making an amplitude value in an actual output to be zero, as shown in FIG. 9(*e*).

The above embodiments and the variations thereof are a few examples of the high-frequency power supply device and the output control method therefor of the present invention, and thus the present invention is not limited thereto. Furthermore, those skilled in the art can modify the present invention in various ways based on the gist of the invention, which modifications are not excluded from the scope of the present invention.

For example, Embodiments 1 and 2 illustrate that the output stop time $T_{st}$ is set at the early outputting stages at the high level L1. Alternatively, the output stop time $T_{st}$ can be set at the early outputting stages at the low level L2, or at the early outputting stages at the high level L1 and the low level L2. This makes it possible to control the wave number to be kept at a constant value for each period during outputting the high-frequency pulse PO.

The configurations illustrated in Embodiments 1 and 2 may not be separate constitutions of the invention, and may be applied as one high-frequency power supply device by combining their respective features.

REFERENCE SIGNS LIST

10 Target Device
100, 200, 300 High-Frequency Power Supply Device
110 Synchronous Pulse Generation Mechanism
112 Synchronous Pulse Formation Circuit
114 Period Reference Signal Generation Unit
116 Clocking Mechanism
120 Output Level Setting Mechanism
122 Level Determination Unit
124 Level Setting Signal Generation Unit
126 First Level Setting Signal Generator
128 Second Level Setting Signal Generator
130 Oscillation Mechanism
132 Clock Pulse Generator
134, 234 Oscillation Amplifier
223 Level-Zero Signal Generator
PO High-Frequency Pulse
P1 Synchronous Pulse
P2 Clock Pulse
$S_s$ Period Reference Signal
$S_T$ Output Stop Signal
$S_{L0}$ Level-Zero Signal
$S_{L1}$ First Level Setting Signal
$S_{L2}$ Second Level Setting Signal
$T_{st}$ Output Stop Time

The invention claimed is:

1. A high-frequency power supply device for outputting a high-frequency pulse to a target device based on a synchronous pulse and a clock pulse, comprising:
a synchronous pulse generation mechanism that generates a synchronous pulse containing output level information and output timing information of the high-frequency pulse; an output level setting mechanism that generates an output level signal for setting an output level of the high-frequency pulse based on the output level information; and an oscillation mechanism that receives a period reference signal of the synchronous pulse and the output level signal to oscillate the high-frequency pulse, wherein the synchronous pulse generation mechanism comprises a synchronous pulse formation circuit that forms the synchronous pulse, a period reference signal generation unit that generates a period reference signal at a period reference time of the synchronous pulse, and a clocking mechanism that clocks an output stop time based on the period reference signal and sends an output stop signal to the output level setting mechanism, the output level setting mechanism comprises a level determination unit that determines an output level set in the high-frequency pulse in response to the output level signal, and a level setting signal generation unit that generates a level setting signal based on a result of the determination made by the level determination unit, the oscillation mechanism comprises a clock pulse generator that generates the clock pulse, and an oscillation amplifier that receives the period reference signal, the level setting signal and the clock pulse to generate the high-frequency pulse based on these signals, wherein the output level setting mechanism stops sending out the level setting signal while the output stop signal is being received.

2. The high-frequency power supply device according to claim 1, wherein the level setting signal includes a first level setting signal for defining a first output level of the high-frequency pulse and a second level setting signal for defining a second output level of the high-frequency pulse, and the level setting signal generation unit comprises a first level setting signal generator that generates the first level setting signal, and a second level setting signal generator that generates the second level setting signal.

3. The high-frequency power supply device according to claim 1, wherein the output level setting mechanism further comprises a level-zero signal generator that generates a level-zero signal for making an amplitude value of the high-frequency pulse to be zero, wherein the level-zero signal generator sends out the level-zero signal while the output stop signal is being received, the oscillation mechanism setting an output of the high-frequency pulse to zero while the level-zero signal is being received.

4. An output control method for a high-frequency power supply device that outputs a high-frequency pulse to a target device based on a synchronous pulse and a clock pulse, comprising generating an output level signal for setting an output level of the high-frequency pulse from output level information contained in a waveform of the synchronous pulse, and generating a period reference signal from output timing information, generating a level setting signal based on the output level signal, and clocking an output stop time based on the period reference signal as well as generating an output stop signal, receiving the period reference signal, the level setting signal and the clock pulse, and when forming the high-frequency pulse based on these signals, stopping sending the level setting signal while the output stop signal is being received.

5. The output control method for the high-frequency power supply device according to claim 4, wherein the level setting signal includes a first level setting signal for defining a first output level of the high-frequency pulse, and a second level setting signal for defining a second output level of the high-frequency pulse.

6. The output control method for the high-frequency power supply device according to claim 4, further generates a level-zero signal for making an amplitude value of the high-frequency pulse to be zero while the output stop signal is being received, and setting an output of the high-frequency pulse to zero while the level-zero signal is being received.

\* \* \* \* \*